(12) United States Patent
Gardner et al.

(10) Patent No.: US 9,567,866 B2
(45) Date of Patent: *Feb. 14, 2017

(54) ENERGY RECLAMATION FROM FLUID-MOVING SYSTEMS

(71) Applicant: Amazon Technologies, Inc., Seattle, WA (US)

(72) Inventors: Brock Robert Gardner, Seattle, WA (US); Michael P. Czamara, Seattle, WA (US)

(73) Assignee: Amazon Technologies, Inc., Reno, NV (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/068,527

(22) Filed: Mar. 11, 2016

(65) Prior Publication Data

US 2016/0194975 A1 Jul. 7, 2016

Related U.S. Application Data

(63) Continuation of application No. 13/659,644, filed on Oct. 24, 2012, now Pat. No. 9,284,850.

(51) Int. Cl.
| | |
|---|---|
| *H02K 7/18* | (2006.01) |
| *F01D 15/10* | (2006.01) |
| *F03B 13/00* | (2006.01) |
| *F24F 5/00* | (2006.01) |
| *F01D 5/02* | (2006.01) |
| *F01D 15/08* | (2006.01) |

(52) U.S. Cl.
CPC ............... *F01D 15/10* (2013.01); *F01D 5/02* (2013.01); *F01D 15/08* (2013.01); *F03B 13/00* (2013.01); *F24F 5/0035* (2013.01); *F05B 2220/20* (2013.01); *F05B 2220/602* (2013.01); *F05D 2220/30* (2013.01)

(58) Field of Classification Search
CPC ........................................................ F01D 15/10
USPC ....................................................... 290/52, 54
See application file for complete search history.

(56) References Cited

U.S. PATENT DOCUMENTS

| | | | |
|---|---|---|---|
| 4,132,901 | A | 1/1979 | Crausbay |
| 4,440,427 | A | 4/1984 | Felton |
| 4,443,707 | A | 4/1984 | Scieri et al. |
| 4,613,279 | A | 9/1986 | Corren et al. |
| 4,691,115 | A | 9/1987 | Robinson |
| 4,698,516 | A | 10/1987 | Thompson |
| 4,801,811 | A | 1/1989 | Assaf et al. |
| 4,960,363 | A | 10/1990 | Bergstein |
| 6,798,080 | B1 | 9/2004 | Baarman et al. |

(Continued)

OTHER PUBLICATIONS

U.S. Appl. No. 14/733,813, filed Jun. 8, 2015, Peter George Ross.

(Continued)

*Primary Examiner* — Tho D Ta
(74) *Attorney, Agent, or Firm* — Robert C. Kowert; Meyertons, Hood, Kivlin, Kowert & Goetzel, P.C.

(57) ABSTRACT

A system includes a building, a fluid-moving system, and a turbine system. The fluid-moving system includes one or more conduits in or coupled to the data center and a pump. The pump moves fluid through the conduits. The turbine system includes a turbine and generator. The turbine has a runner in a flow of fluid in one of the conduits. The generator produces electricity from rotation of the runner.

20 Claims, 6 Drawing Sheets

(56) References Cited

U.S. PATENT DOCUMENTS

| | | |
|---|---|---|
| 6,856,037 B2 | 2/2005 | Yazawa et al. |
| 7,429,803 B2 | 9/2008 | Davis |
| 8,022,567 B2 | 9/2011 | Davis et al. |
| 8,188,613 B2 | 5/2012 | Lee |
| 8,310,077 B2 | 11/2012 | Pearce |
| 8,344,536 B1 | 1/2013 | Gotay |
| 8,405,236 B2 | 3/2013 | David |
| 8,492,918 B1 | 7/2013 | Kamenov |
| 8,616,830 B2 | 12/2013 | Unno |
| 8,643,206 B2 | 2/2014 | Ekern |
| 8,680,704 B1 | 3/2014 | Rooney |
| 8,736,098 B2 | 5/2014 | Choi et al. |
| 8,742,612 B1 | 6/2014 | Robbins et al. |
| 9,284,850 B1 * | 3/2016 | Gardner .................. F01D 15/10 |
| 2009/0097205 A1 | 4/2009 | Matsushima et al. |
| 2009/0251860 A1 | 10/2009 | Belady et al. |
| 2010/0070090 A1 | 3/2010 | Mirpourian et al. |
| 2011/0058929 A1 | 3/2011 | Smith et al. |
| 2011/0227344 A1 | 9/2011 | Hatton et al. |
| 2011/0278928 A1 | 11/2011 | Burger et al. |
| 2011/0316337 A1 | 12/2011 | Pelio et al. |
| 2012/0286514 A1 | 11/2012 | Graybill et al. |
| 2013/0026761 A1 | 1/2013 | Rajadhyaksha et al. |
| 2013/0049473 A1 * | 2/2013 | Brech .................. H02J 9/08 |
| | | 307/68 |

OTHER PUBLICATIONS

Martin Anyi, Brian Kirke "Evaluation of small axial flow hydrokinetic turbines for remote communities" Energy for Sustainable Development 14 (2010) pp. 110-116.

"Hydro-Electric-Barrel Generator" published Jul. 29, 2012 on www.hydro-electric-barrel.com/index, 1 page.

Whitepaper: "In-Stream Hydrokinetic Turbines" published Jul. 29, 2012 pp. 1-6.

U.S. Appl. No. 13/655,301, filed Oct. 18, 2012, Jerry James Hunter.

U.S. Appl. No. 13/632,766, filed Oct. 1, 2012, Michael P. Czamara.

\* cited by examiner

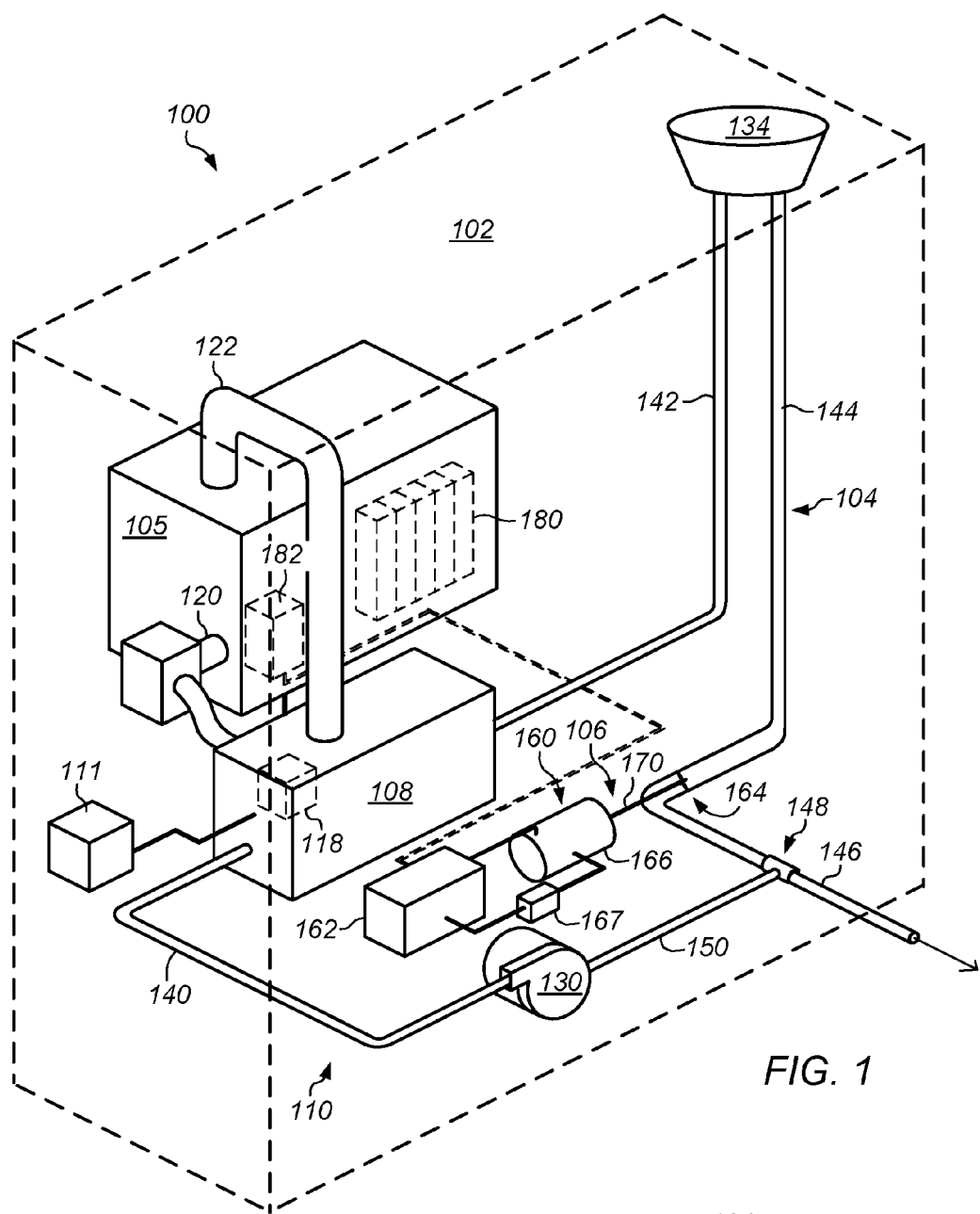
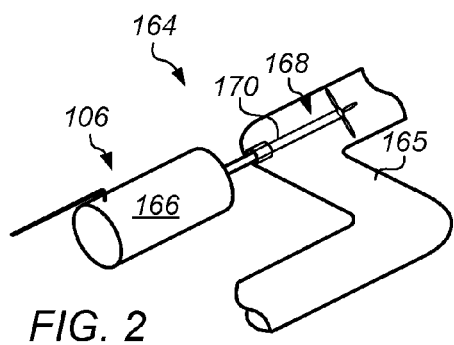
FIG. 1
FIG. 2

ENERGY RECLAMATION FROM FLUID-MOVING SYSTEMS

This application is a continuation of U.S. patent application Ser. No. 13/659,644, filed Oct. 24, 2012, now U.S. Pat. No. 9,284,850, which is hereby incorporated by reference herein in its entirety.

BACKGROUND

A typical commercial or industrial building includes fluid systems that carry fluids from one place to another within the building. Examples of fluid systems in buildings include utility water systems for personal use, process water systems for industrial use, cooling systems, heating systems, and wastewater removal systems. The initial and ongoing costs of installing and operating fluid systems may add substantial cost and complexity to the building and its operation. In addition, in many buildings, fluid systems may be relatively inefficient in that a substantial amount of energy (for example, thermal, kinetic, and potential energy) is wasted.

Commercial and industrial buildings often include components and systems to provide back-up power to electrical systems in the event of a failure of components or systems in a primary electrical power system. Providing full redundancy of electrical power may, however, be costly both in terms of capital costs (in that in may require a large number of expensive switchboard, UPSs, and PDUs, for example) and in terms of costs of operation and maintenance. In addition, some facilities do not provide redundant power for cooling systems.

BRIEF DESCRIPTION OF THE DRAWINGS

FIG. 1 illustrates one embodiment of a data center including a turbine system for reclaiming energy from a cooling system in the data center.

FIG. 2 is a detail view of a turbine system including a runner in a conduit of the fluid-moving system.

Figure 3:
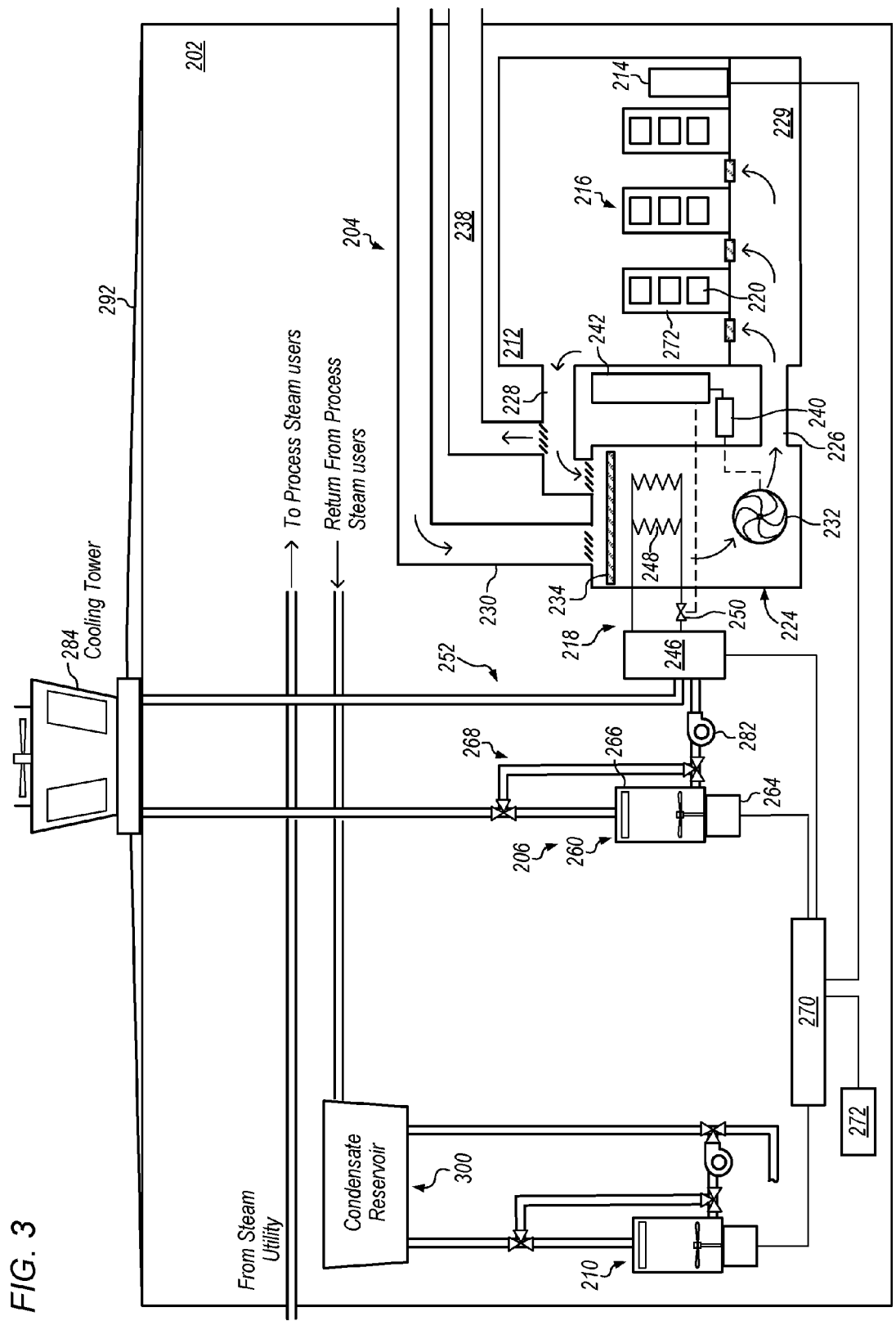
FIG. 3 is a schematic diagram illustrating one embodiment of a data center building with fluid-flow energy reclamation systems.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Systems and methods for reclaiming or recovering energy from moving fluids are disclosed. According to one embodiment, a data center includes a computing room, computing devices in the computing room, a fluid-moving system, a turbine system, and an electrical energy storage device. The fluid-moving system includes one or more conduits in or coupled to the data center and a pump. The pump moves fluid through the conduits. The turbine system includes a turbine and generator. The turbine has a runner in a flow of fluid in one of the conduits. The generator produces electricity from rotation of the runner. An electrical energy storage device may store electrical energy produced by the generator. The electrical energy storage device can supply electrical power to the liquid-moving system, the computing devices, or both.

According to one embodiment, a system includes a building, a fluid-moving system, and a turbine system. The fluid-moving system includes one or more conduits in or coupled to the data center and a pump. The pump moves liquid through the conduits. The turbine system includes a turbine and generator. The turbine has a runner in a flow of liquid in one of the conduits. The generator produces electricity from rotation of the runner.

According to one embodiment, a method of generating power includes placing a turbine system in a flow of liquid in a conduit passing through a building, generating electricity from a flow of the liquid through or across at least a portion of a runner of the turbine system, and transmitting electrical power from the turbine system to an electrical energy storage device.

As used herein, a "conduit" means a pipe, cylinder, tube, or channel, or combination of such elements, that can be used to convey a fluid from one location to another. A conduit may have any cross section, including square, rectangular, circular, ovate, or irregular. A conduit may have a uniform cross sectional area over its length or a varying cross sectional area over its length. A conduit may, for example, include a converging section in which the cross sectional area of the conduit decreases, a diverging section in which the cross sectional area of the conduit increases, or both.

As used herein, "fluid-moving system" means a system that provides or moves fluid to, or removes fluid from, one or more systems or components. A fluid in a fluid-moving system may be a liquid, a gas, or a combination thereof.

As used herein, "hydrokinetic" power generation means generating power by harnessing kinetic energy of moving water.

As used herein, a "pump" means a system or device that can move fluid.

As used herein, a "runner" means an element, or combination of elements, of a turbine that moves in response to fluid flow. Examples of a runner include a rotor, a propeller, a waterwheel, or a screw.

As used herein, a "turbine" means a device or system that produces rotary motion from a moving fluid. Examples of turbine types include a blade turbine, helix turbine, bladeless turbine, and statorless turbine. A turbine may be shrouded or unshrouded.

As used herein, a "turbine system" means a system that includes one or more turbines.

As used herein, a "screening system" means a system, device, or element that can block or catch objects in a flow of fluid while allowing a flow of fluid through. Examples of screening devices include a mesh, a grate, a grid, or a screen.

As used herein, "air moving device" includes any device, element, system, or combination thereof that can move air. Examples of air moving devices include fans, blowers, and compressed air systems.

As used herein, "computing" includes any operations that can be performed by a computer, such as computation, data storage, data retrieval, or communications.

As used herein, "computing device" includes any of various devices in which computing operations can be carried out, such as computer systems or components thereof. One example of a computing device is a rack-mounted server. As used herein, the term computing device is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. Some examples of computing devices include e-commerce servers, network devices, telecommunications equipment, medical equipment, electrical power management and control devices, and professional audio equipment (digital, analog, or combinations thereof). In various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers dedicated to specific functions or serving multiple functions. Examples of computer operations include information processing, communications, simulations, and operational control.

As used herein, "mechanical cooling" means cooling of air by a process that involves doing mechanical work on at least one fluid, such as occurs in vapor-compression refrigeration systems.

As used herein, a "module" is a component or a combination of components physically coupled to one another. A module may include functional elements and systems, such as computer systems, circuit boards, racks, blowers, ducts, and power distribution units, as well as structural elements, such a base, frame, housing, or container.

As used herein, "rack computing systems" means a computing system that includes one or more computing devices mounted in a rack.

As used herein, "reserve power" means power that can be supplied to an electrical load upon the failure of, or as a substitute for, primary power to the load.

As used herein, "room" means a room or a space of a building. As used herein, "computer room" means a room of a building in which computing devices, such as rack-mounted servers, are operated.

As used herein, a "space" means a space, area or volume.

In various embodiments, a system includes a turbine system that generates electricity from fluid moved by a fluid-moving system. In some embodiments, a turbine system may reclaim energy that has been added to fluid by components in the fluid-moving system (for example, by a pump that moves fluid through the fluid-moving system.) FIG. 1 illustrates one embodiment of a data center including a turbine system for reclaiming energy from a cooling system in the data center. FIG. 2 is a detail view of a turbine system including a runner in a conduit of the fluid-moving system shown in FIG. 1. Data center 100 includes building 102, cooling system 104, computing room 105, and energy reclamation system 106.

Cooling system 104 may remove heat from data center 100. Cooling system 104 includes computer room air conditioning unit 108, cooling tower system 110, and cooling system controller 111. Computer room air conditioning unit 108 may move air through computing room 105 to remove heat from electrical systems operating in the computing room. Cooling tower system 110 may remove heat from computer room air conditioning unit 108 and reject heat to outside air.

Computer room air conditioning unit 108 includes heat exchangers, air moving device 118, supply duct 120, and return duct 122. Air moving device 118 may move air across heat exchangers in computer room air conditioning unit 108 and circulate air through computing room 105.

Cooling tower system 110 includes pump 130 and cooling tower 134. Water from pump 130 is carried to heat exchangers in computer room air conditioning unit 108 by way of line 140. Heated water from computer room air conditioning unit 108 is carried to cooling tower 134 by way of cooling tower supply line 142. Water from cooling tower 134 may be returned to pump by way of cooling tower return line 144. Water from cooling tower 134 may also be expelled from building 102 by way of discharge line 146. Valve 148 may be used to control the flow of water between discharge line 146 and suction line 150. Elements of cooling tower system 110 form a may include a closed loop that includes pump 130, heat exchangers in computer room air conditioning unit 108, and cooling tower 134.

Energy reclamation system 106 includes turbine system 160 and electrical energy storage system 162. Turbine system 160 includes turbine 164, generator 166, and turbine system controller 167. Turbine 164 is installed in conduit 165 of cooling tower return line 144. Turbine 164 includes runner 168 and turbine shaft 170. Turbine shaft 170 may extend into passage in conduit 165. Turbine system 160 may include one or more seals to contain water in line at the point of entry into conduit 165. Runner 164 may rotation on turbine shaft 170. Runner 168 may rotate in response to water passing through conduit 165.

Generator 166 may be coupled to turbine 160 by way of a drive system. The drive system may include elements that link shaft 170 to an input shaft in generator 166.

Elements linking a rotor to a generator may include, for example, one or more sheaves coupled to one another by way a belt or chain.

In some embodiments, elements of the drive system are selected to control a ratio for rotation of a rotor shaft relative to a generator shaft. For example, a sheave and belt system may be used to establish a 10:1 ratio between an input shaft of generator 166 and turbine shaft 170. In certain embodiments, a turbine system includes a gearbox for controlling a ratio between rotation of a rotor and a generator shaft.

In some embodiments, turbine system 160 is operated to generate electricity from water moving through cooling tower system 110. For example, as water moves through conduit 165, runner 168 may turn. Rotation of runner 168 may drive generator 166 to produce electricity. Electrical energy produced by rotation of the turbine may be stored in electrical energy storage system 162.

In some embodiments, turbine system controller 167 controls operation of turbine system 160 to generate electricity from moving liquid in cooling tower system 110. In one embodiment, turbine system controller 167 includes a programmable logic controller. Turbine system controller 167 may control, for example, whether turbine system 160 is on or off, a rate of charging of energy storage device, or a gear ratio between runner 168 and an input shaft of generator 166. In certain embodiments, turbine system controller 167 controls the release of water from a reservoir at a higher elevation than turbine 164 (such as a reservoir in cooling tower 134).

In some embodiments, electrical energy generated from a turbine coupled to a liquid moving system is used to provide electrical power for operating components of a cooling system. For example, electrical energy storage system 162 may be used to supply power to cooling system controller 111 or to air moving device 118. In some embodiments, electrical energy storage system 162 serves as a back-up electrical power system for cooling system 104. In one embodiment, electrical energy storage system 162 includes an uninterruptible power supply.

Computing room 105 includes rack computing systems 180 and data center power distribution system 182. Power distribution system 182 may draw power from electrical energy storage system 162 and supply electrical power to computing devices in rack computing systems 180. In some embodiments, power distribution system 182 uses power generated by energy reclamation system 106 as a reserve power. For example, power system may draw from turbine-generated power only in the event of a failure of a primary power system. In one embodiment, power distribution system 182 includes an automatic transfer switch that switches power from a primary power system to electrical energy storage system 162 in response to a failure in the primary power system.

In certain embodiments, a system draws from turbine-generated power based on varying loads in the data center. For example, power distribution system 182 may draw from electrical energy storage system 162 when loads in the data center exceed a predetermined threshold (for example, during peak operating times).

In some embodiments, electrical energy reclaimed from fluid in a fluid-moving system by a turbine system is used to provide electrical power for electrical systems in a building. In some embodiments, electrical energy generated from a turbine air system is used to provide electrical power for operating components of a data center cooling system. For example, electrical energy storage system 162 may be used to supply power to an air moving device, or components of air handling unit or chilled water sub-system. In one embodiment, electrical energy reclaimed from fluid by a turbine in a fluid-moving system is supplied to a pump for the fluid-moving system. In some embodiments, electrical energy storage system 162 serves as a back-up electrical power system for a cooling system. In one embodiment, electrical energy storage device 162 includes an uninterruptible power supply.

In FIGS. 1 and 2, turbine 164 is shown for illustrative purposes as a propeller-type horizontal-axis turbine. A turbine system may nevertheless be, in various embodiments, of any suitable type for operating in moving fluid. A turbine may have a horizontal-axis, vertical-axis, or other axis alignment. The flow arrangement of a turbine may axial, radial, or a combination thereof. Examples of runners for a turbine include a set of blades, a propeller, or a screw. Blades of a turbine may be straight, helical, or other shape. Turbines may be reaction-type or impulse-type.

In FIG. 1, an energy reclamation system is shown in a data center. An energy reclamation system with a fluid flow reclamation turbine may nevertheless, in various embodiments, be included in various other types of buildings. Examples of buildings that may have a system for harnessing energy from moving liquids include an office building, a factory, a medical care facility, a residence, or a sports facility. In one embodiment, an energy reclamation system with a fluid flow reclamation turbine is included in an industrial facility. Energy reclaimed from a fluid-moving system in a building may be used immediately or store for later use. Energy reclaimed from a fluid-moving system may be used to supply electrical power to any of various electrical systems in a building. Examples of electrical systems that may use power from a turbine in a fluid-moving system include robotic devices, industrial machines, hospital equipment, office equipment, and telecommunication systems.

In FIG. 1, a fluid flow turbine system is shown for illustrative purposes harnessing energy from a fluid loop of a chilled water system. A fluid-flow turbine system may nevertheless, in various embodiments, harness energy from other fluid-moving systems in or connected to a building. In one embodiment, a fluid-flow turbine harnesses energy condensed steam that has been delivered to a building. In one embodiment, a turbine harnesses energy from an evaporative cooling system. In certain embodiments, a turbine harnesses energy from a pressurized gas system.

FIG. 3 is a schematic diagram illustrating one embodiment of a data center building with fluid-flow energy reclamation systems. System 200 includes building 202, data center 204, cooling system energy reclamation system 206, and condensate energy reclamation system 210.

Data center 204 includes computing room 212, electrical power distribution system 214, rack computing systems 216, and CRAC unit 218. CRAC unit 218 may be operated to remove heat from computing devices 220 operating in racks 222.

CRAC unit 268 may be coupled to computing room 262 by supply duct 226 and return duct 228. Cooling air may flow from air handling sub-system 224 through supply duct 226 into plenum 229. From plenum 229, cooling air may pass through into computing room 212. Cooling air may pass through racks 222. After the air is heated by electrical systems in racks 222, the air may pass through return duct 228. Air may be recirculated through one or more air handling sub-systems or discharged from the system through exhaust vent 230.

CRAC unit 218 includes fan 232, filter 234, return air dampers, outside air vent 238, and outside air dampers. Fan 232 is coupled to VFD 240. VFD 240 is coupled to control unit 242. Return air vents may receive air returning from data center room through return duct. Outside air vent 238 may receive outside air. VFD 240 may receive control signals from control unit 242 and subsequently modulate a rotational velocity of fan 232. In certain embodiments, an outside air damper, return air damper, exhaust damper, or combinations thereof, are modulated via a control system to modulate air flow.

CRAC unit 218 includes chilled water subsystem 246. Chilled water subsystem 246 may be coupled in heat transfer communication with air handling sub-system 224. Chilled water sub-system 246 includes coils 248 and valve 250. Valve 250 is coupled to control unit 242. Valve 250 may be opened and closed by signals from control unit 242. The position of valve 250 may be used to regulate the use of chilled water to cool air in air handling sub-system 224. In one embodiment, a common chilled water subsystem provides chilled water to two more air handling sub-systems. In certain embodiments, each of two or more air handling sub-systems is cooled by a dedicated chilled water subsystem.

Chilled water subsystem 246 is coupled to a chilled water heat removal system 252. In the embodiment shown in FIG. 1, chilled water heat removal system 252 is a cooling tower system. Examples of chilled water heat removal systems that may be included in other embodiments include a service water subsystem or an air-conditioning refrigerant subsystem.

Control unit 242 may be programmed to control devices in handling sub-systems 224 and/or chilled water sub-systems 246. Control unit 242 may be coupled to fan 232, return air dampers, outside air dampers, and exhaust dampers. Control unit 242 may be in data communication with temperature sensors and pressure sensors. Devices in air handling sub-system 224 and chilled water sub-system 252 may be controlled automatically, manually, or a combination thereof.

Electrical power system 214 may include one or more transformer, generators, switchgear apparatus, and primary power systems. Each of primary power systems may include a UPS and one or more floor power distribution units ("PDUs").

Electrical systems in rack computing systems 216 may each receive power from one or more of primary power systems. In one embodiment, each of the primary power systems corresponds to, and provides power to, the servers in one room in a data center. In one embodiment, each of the primary power systems corresponds to, and provides power to, one rack system in a data center.

Electrical power system 214 may be coupled to a utility feed. In certain embodiments, the utility feed is at a voltage of about 13.5 kilovolts or 12.8 kilovolts at a frequency of about 60 Hz. A UPS may provide uninterrupted power to rack computing systems 216 in the event of a power failure upstream from the UPS.

Electrical power system 214 may include a reserve power system. The reserve power system may provide reserve power for any or all of the electrical systems supplied by one or more primary power systems. In some embodiments, a reserve power system is powered up at all times during operation of a data center. The reserve power system may be passive until a failure of one or more components of the primary power system for one or more of the electrical systems in the system, at which time the reserve power system may become active.

Control unit 242 is in data communication with temperature sensors, pressure sensors, or both. In certain embodiments, a control unit includes at least one programmable logic controller. The PLC may, among other things, regulate air moving devices and open and close valves or dampers in cooling air systems based upon command signals from an operator to move air flow through a data center as necessary for the prevailing operational conditions. Alternatively, the PLC may modulate valves and dampers between fully open and fully closed positions to modulate airflow.

A control system may include temperature measurement devices that are, in one embodiment, thermocouples. Alternatively, the temperature measurement devices include, but are not limited to, resistance temperature detectors (RTDs) and any device that facilitate cooling operation as described herein. For example, a thermocouple may be positioned within mixing plenum to facilitate measuring a temperature of the air the mixing plenum.

Cooling system energy reclamation system 206 and condensate energy reclamation system 210 each include turbine systems 260. Each of turbine systems 260 includes turbine 262, generator 264, screen device 266, and turbine bypass 268. Each of cooling system energy reclamation system 206 and condensate energy reclamation system 210 may reclaim energy from fluid through turbine system 260. Electrical power from generators 264 from the operation of turbines 262 may be transmitted to electrical energy storage device 270. Energy reclamation control unit 272 may be operated to control electrical energy storage device 270, generators 264, and the control of flow through turbines 262. For example, in one embodiment, energy reclamation control unit 272 operates valves 276 on bypass 268.

Cooling system energy reclamation system 206 may harness energy from liquid moving through chilled water heat removal system 252. Water may be pumped by pump 282 through chilled water sub-system 246 and cooling tower 284. Valves may be opened to allow water from cooling tower 284 to flow through turbine system 260 of cooling system energy reclamation system 206. In some embodiments, water passing out of turbine system 260 of cooling system energy reclamation system 206 may be discharged from the system (for example into a drain).

Condensate energy reclamation system 210 may harness energy captured in condensate reservoir 300. Water in condensate reservoir 300 may be collected from condensation of steam provided from a steam utility. Valves may be opened to allow water from condensate reservoir 300 to flow through turbine system 260 of condensate energy reclamation system 210. In some embodiments, water passing out of turbine system 260 of condensate energy reclamation system 210 may be discharged from condensate energy reclamation system 210.

Figure 4:
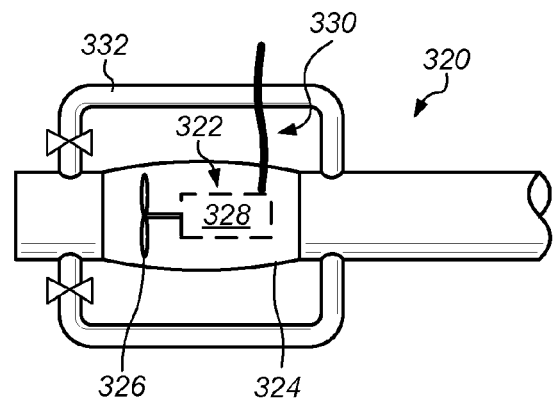
FIG. 4 illustrates one embodiment of a turbine system having a sealed generator unit installed in a fluid conduit.

In some embodiments, a system includes a generator that is sealed within fluid flow in a conduit. FIG. 4 illustrates one embodiment of a turbine system having a sealed generator unit installed in a fluid conduit. System 320 includes turbine system 322 in conduit 324. Turbine system 322 may be mounted in conduit 324. Turbine system 322 includes runner 326 and generator unit 328. Generator unit 328 may be in a sealed housing within a fluid flow in conduit 324. Electrical power produced in generator unit 328 from rotation of runner 326 may be transmitted through insulated electrical lines 330. Turbine system 322 may include valves for directing fluid through dual bypass 332.

In some embodiments, a turbine system includes a helical runner. In various embodiments, the shaft of a helical runner may be oriented in-line with the direction of flow, perpendicular to the direction of flow, or any other suitable angle.

Figure 5:
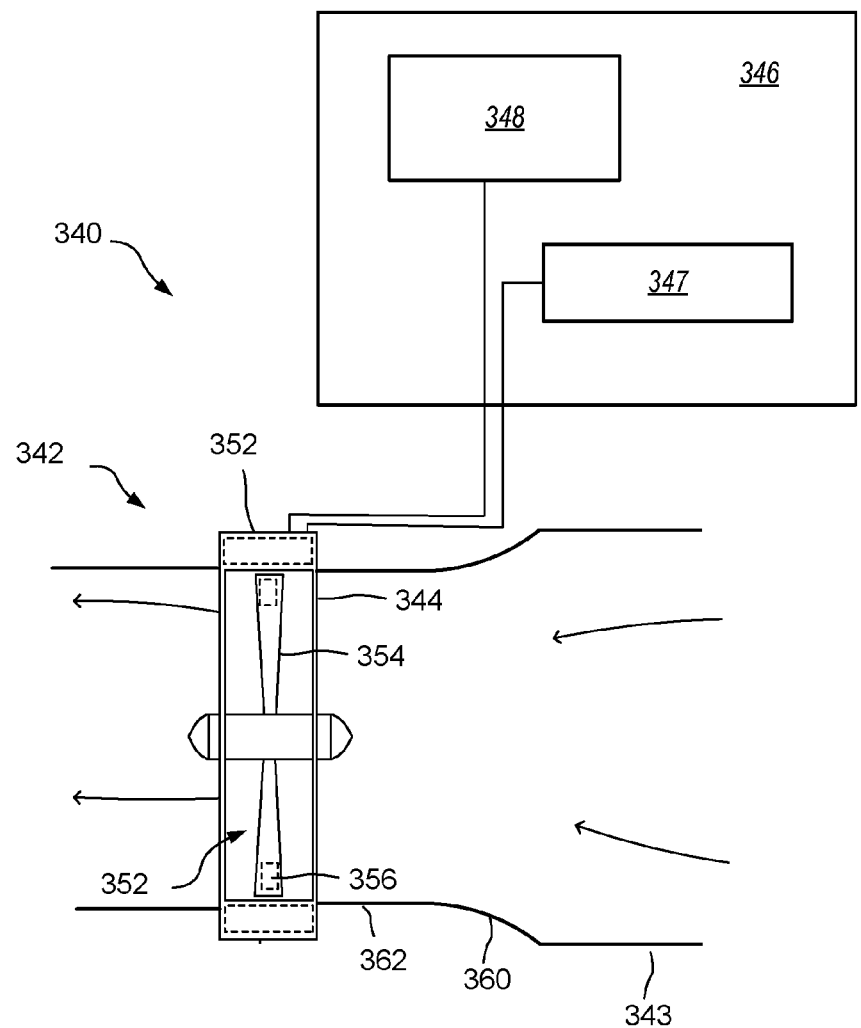
FIG. 5 illustrates one embodiment of an energy recovery system with a turbine system having a stator ring.

FIG. 5 illustrates one embodiment of an energy recovery system with a turbine system having a stator ring. System 340 includes turbine system 342. Turbine system 342 receives fluid flow passing through pipe 343. The fluid-moving system in which pipe 343 is included may be similar to that described above relative to FIG. 1.

Turbine system 342 includes turbine 344 and turbine control unit 346. Turbine 344 includes rotor 350 and stator ring 352. Rotor 350 includes blades 354 and magnetic elements 356. Turbine control unit 346 includes control unit 347 and energy storage device 348. Energy storage device 348 may include an uninterruptible power supply.

As rotor 350 spins in response to liquid moving through turbine 342, motion of magnetic elements 356 relative to stator ring 352 may induce electrical current in stator ring 352. Energy generated by turbine 352 may be stored in energy storage device 348.

In some embodiments, fluid flow to a turbine is controlled to promote electricity generation. In one embodiment, fluid is channeled through a passage having a decreasing cross sectional area such that the velocity of fluid is higher when it passes through a turbine. For example, conduit 360 converges to neck 362. The intake of turbine is at a reduced cross section part of conduit 360, in this case, neck 362. The velocity of fluid flowing through conduit 360 at neck 362 may be higher than the velocity of the fluid upstream from the intake of turbine 344.

Figure 6:
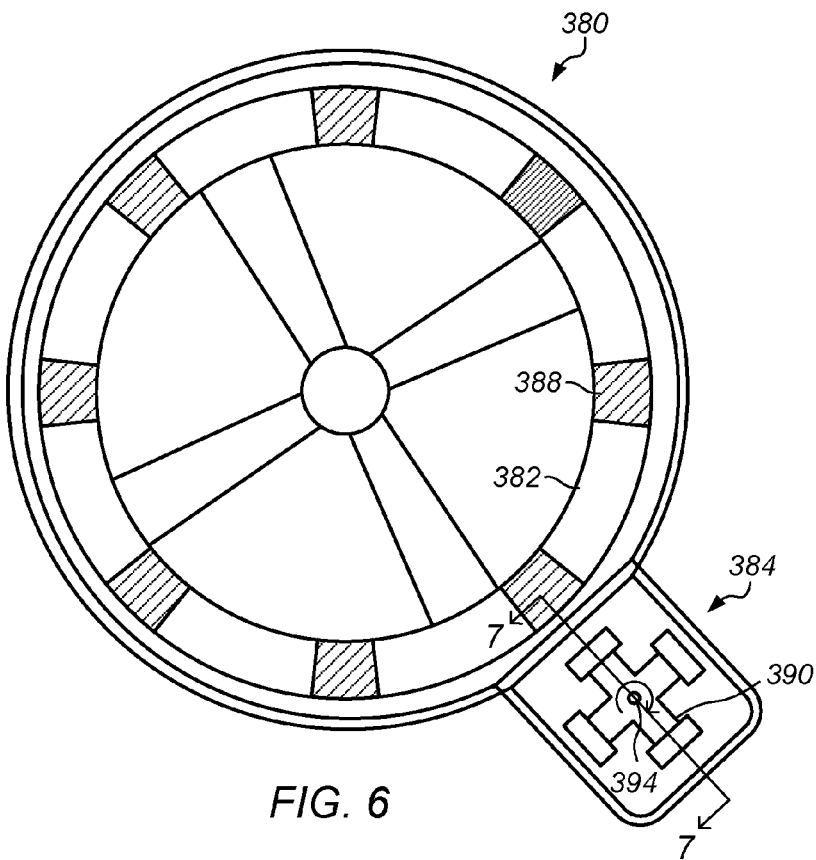
FIG. 6 is cross sectional view of one embodiment of a turbine system having a generator mounted on the periphery of a pipe.
Figure 7:
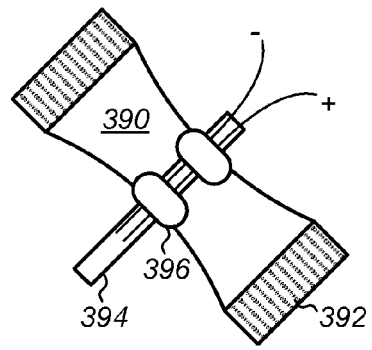
FIG. 7 is a cross sectional view illustrating a generator that can be driven by a turbine.

In some embodiments, a runner of turbine includes magnetic elements that drive a motor mounted external to the flow of a fluid. FIG. 6 is cross sectional view of one embodiment of a turbine system having a generator mounted on the periphery of a pipe. Turbine system 380 includes runner 382 and generator 384. Runner 382 is mounted for rotation in flow within pipe 386. Runner 382 includes magnetic elements 388. As runner 382 rotates in response to a flow of fluid through pipe 386, the motion of magnetic elements 388 relative to generator 384 may induce rotation of rotor 390 of generator 384. FIG. 7 is a cross sectional view of generator 384 taken along lines 7-7 of FIG. 6. Rotor 390 includes magnets 392. Rotor 390 rotates about shaft 394. Electricity induced in coils 396 from rotation of rotor 390 may be transmitted via output lines 398.

Energy produced by generator 384 may be stored in an electrical storage device, such as described above relative to FIG. 1.

Figure 8:
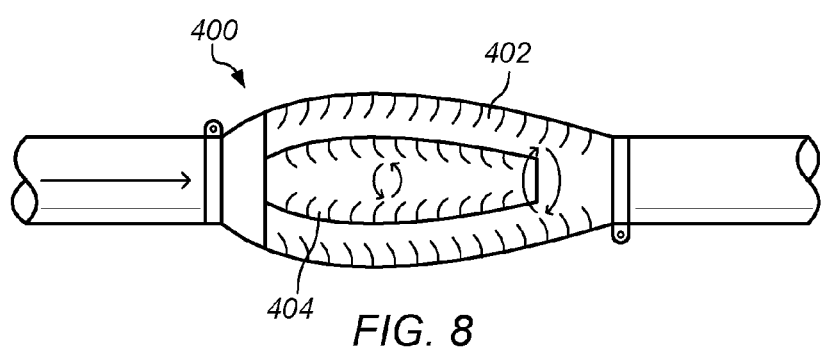
FIG. 8 illustrates an embodiment of a turbine system that includes counter-rotating runners.

FIG. 8 illustrates an embodiment of a turbine system that includes counter-rotating runners. Turbine system 400 includes outer runner 402 and inner runner 404. Outer runner 402 and inner runner 404 may rotate in opposite directions in response to flow through turbine system 400. Outer runner 402, inner runner 404, or both, may be coupled to a generator to produce electricity. Electrical energy produced by generator 384 may be stored in an electrical storage device, such as described above relative to FIG. 1.

Figure 9:
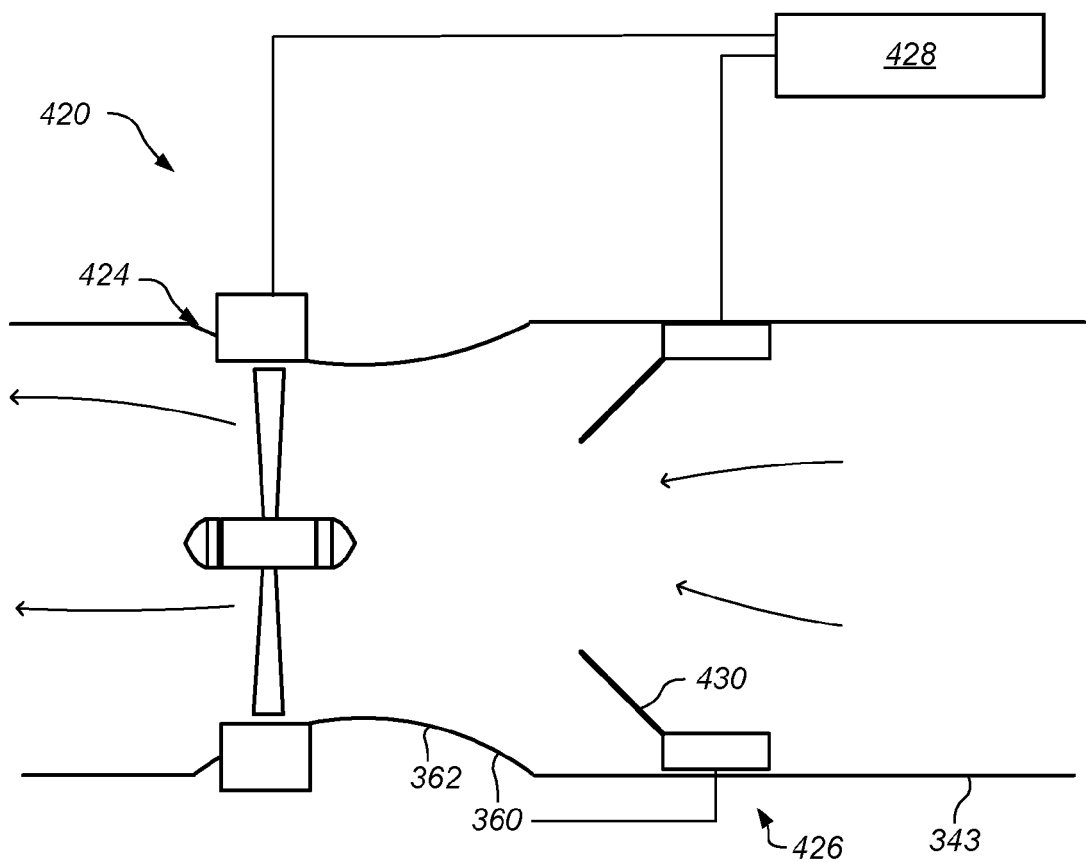
FIG. 9 illustrates a system with a variable flow mechanism for a turbine of an energy recovery system.

In some embodiments, a system includes a mechanism for varying flow through a turbine in a liquid-moving system. FIG. 9 illustrates a system with a variable flow mechanism for a turbine. System 420 includes liquid-moving system 422, turbine system 424, flow control mechanism 426, and energy recovery control unit 428. Flow control mechanism 426 is coupled to energy recovery control unit 428. Flow control mechanism 426 includes movable vanes 430. Flow control mechanism 426 may be controlled by energy recovery control unit 428 to alter flow to the intake of turbine system 424. For example, flow control mechanism 426 may be operated to divert a flow of liquid into turbine system 424, to increase liquid velocity at the inlet of turbine system 424, or both. In some embodiments, a flow control mechanism for a turbine includes a variable nozzle.

In some embodiments, energy recovery control unit 428 operates flow control mechanism 426 to optimize generation of electricity by turbine system 424. As an example, energy recovery control unit 428 may operate flow control mechanism 426 to vary the flow of liquid to turbine system 424 based on a flow rate through liquid-moving system 422. In certain embodiments, energy recovery control unit 428 operates flow control mechanism 426 to vary the flow to turbine system 424 based on a variable frequency drive for an air moving device generating air flow to a turbine system. In one embodiment, flow control mechanism 426 may be operated based on the frequency of a variable frequency drive for a pump moving liquid through turbine system 424.

Figure 10:
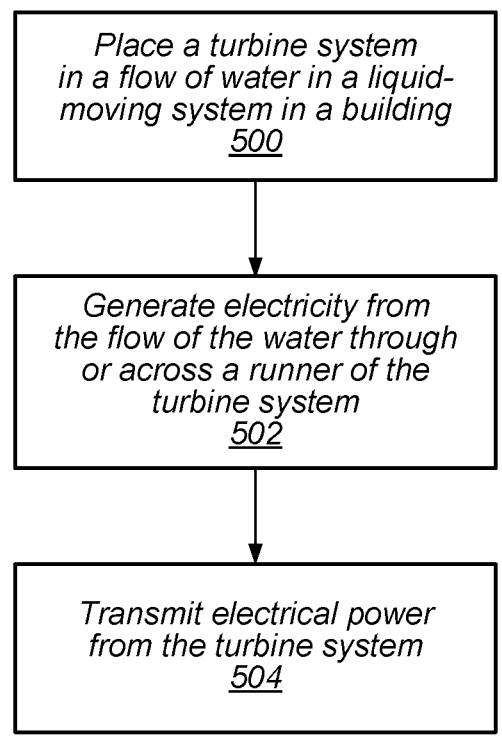
FIG. 10 illustrates generating power from a flow of fluid in a building.

FIG. 10 illustrates generating power from flow of fluid in a building. At 500, a turbine system is placed in a flow of liquid in a liquid-moving system in a building. In some embodiments, the liquid is water. In some embodiments, the liquid moving system includes a reservoir that is at a higher elevation than a runner for the turbine system.

At 502, electricity is generated from flow of the water through or across a runner of the turbine system. The turbine may be oriented, positioned, or both, to promote motion of the runner.

At 504, electrical power from the turbine system is transmitted from the generator. In some embodiments, the electrical power is transmitted to an electrical storage device. The electrical energy storage device may include, in one embodiment, an uninterruptable power supply. In some embodiments, the electrical power is immediately consumed by one or more electrical systems in the building. In some embodiments, a turbine system provides electrical power to electrical loads in a data center. In certain embodiments, a turbine system is used to provide supplemental or back-up power computing devices in a data center. In certain embodiments, a turbine system is used to provide back-up power to cooling systems the data center.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A data center, comprising:
a plurality of computing devices;
a fluid-moving system, comprising an elevated reservoir configured to collect liquid from a subsystem of the fluid-moving system at an elevated location in the data center;
a turbine system at a lower elevation in the data center than the elevated location; and
one or more conduits connecting the elevated reservoir and the turbine system, wherein the turbine system comprises:
a turbine comprising one or more runners in a flow of liquid in at least one of the conduits; and
a generator configured to produce electricity from rotation of at least one of the runners in the flow of liquid.

2. The data center of claim 1, wherein the fluid-moving system comprises a steam subsystem, and wherein the elevated reservoir of the fluid-moving system is configured to collect condensed steam from the steam subsystem.

3. The data center of claim 1, wherein the fluid-moving system comprises an evaporative cooling subsystem, and wherein the elevated reservoir of the fluid-moving system is configured to collect water from the evaporative cooling subsystem.

4. The data center of claim 1, wherein the fluid-moving system comprises a cooling tower subsystem, and wherein the elevated reservoir of the fluid-moving system is configured to collect water that has passed through the cooling tower subsystem.

5. The data center of claim 1, wherein the fluid-moving system further comprises:
a pump; and
one or more additional conduits,
wherein the pump is configured to cause liquid to flow from a lower elevation in the data center to a higher elevation in the data center via the one or more additional conduits,
wherein the higher elevation in the data center is at an elevation in the data center greater than or equal to the elevated location of the elevated reservoir.

6. The data center of claim 1, wherein the fluid-moving system further comprises:
a control unit; and
one or more flow control mechanisms,
wherein the control unit is configured to cause the one or more flow control mechanisms to move to adjust the flow of liquid through the turbine.

7. The data center of claim 1, further comprising:
an energy storage system configured to store electricity produced by the generator.

8. The data center of claim 7, wherein the energy storage system comprises an uninterruptible power supply configured to provide uninterruptible power support to at least some of the plurality of computing devices of the data center.

9. A system, comprising:
a building;
a fluid-moving system comprising an elevated reservoir configured to collect a liquid from a subsystem of the fluid moving system at an elevated location in the building;
a turbine system at a lower elevation in the building than the elevated location; and
one or more conduits connecting the elevated reservoir and the turbine system, wherein the turbine system comprises:
a turbine comprising one or more runners in a flow of liquid in at least one of the one or more conduits; and
a generator configured to produce electricity from rotation of at least one of the one or more runners in the flow of liquid;
a control unit; and
one or more flow control mechanisms,
wherein the control unit is configured to cause the one or more flow control mechanisms to move to adjust the flow of liquid through the turbine.

10. The system of claim 9, further comprising an energy storage device configured to store electrical energy produced by the generator, wherein the energy storage device provides back-up electrical power for a cooling system of the building.

11. The system of claim 9, wherein the fluid-moving system comprises an evaporative cooling subsystem, and wherein the elevated reservoir of the fluid-moving system is configured to collect water from the evaporative cooling subsystem.

12. The system of claim 9, wherein the fluid-moving system comprises a steam subsystem, and wherein the elevated reservoir of the fluid-moving system is configured to collect condensed steam from the steam subsystem.

13. The system of claim 9, wherein the fluid-moving system comprises a cooling tower subsystem, wherein the elevated reservoir of the fluid-moving system is configured to collect water that has passed through the cooling tower subsystem.

14. The system of claim 9, wherein the control unit is configured to control a rate of release of liquid from the elevated reservoir.

15. A system comprising:
an elevated liquid collection reservoir configured to collect liquid from a subsystem of a fluid-moving system;
a turbine system at lower elevation than the elevated liquid collection reservoir; and
one or more conduits connecting the elevated liquid collection reservoir and the turbine system, wherein the turbine system comprises:
a turbine comprising one or more runners in a flow of liquid in at least one of the conduits;
a generator configured to produce electricity from rotation of at least one of the runners in the flow of liquid;
a control unit; and
one or more flow control mechanisms,
wherein the control unit is configured to cause the one or more flow control mechanisms to move to adjust the flow of liquid through the turbine.

16. The system of claim 15 further comprising:
an energy storage device configured to store electricity produced by the generator.

17. The system of claim 15, wherein the one or more flow control mechanisms are mounted upstream of the turbine.

18. The system of claim 15, wherein the one or more flow control mechanisms comprise one or more variable nozzles.

19. The system of claim 15, further comprising a fluid-moving system, wherein the liquid collection reservoir is a part of the fluid-moving system, and wherein the control unit is configured to adjust a quantity of a liquid circulating through the fluid-moving system that is diverted to flow through the turbine.

20. The system of claim 19, wherein the quantity of the liquid that is diverted to flow through the turbine is discharged from the fluid-moving system subsequent to flowing through the turbine.

* * * * *